US006985965B2

(12) United States Patent
Hannu et al.

(10) Patent No.: US 6,985,965 B2
(45) Date of Patent: *Jan. 10, 2006

(54) STATIC INFORMATION KNOWLEDGE USED WITH BINARY COMPRESSION METHODS

(75) Inventors: Hans Hannu, Lulea (SE); Jan Christoffersson, Lulea (SE); Krister Svanbro, Lulea (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 730 days.

This patent is subject to a terminal disclaimer.

(21) Appl. No.: 09/814,406

(22) Filed: Mar. 21, 2001

(65) Prior Publication Data

US 2002/0059462 A1 May 16, 2002

Related U.S. Application Data

(60) Provisional application No. 60/249,642, filed on Nov. 16, 2000, provisional application No. 60/249,923, filed on Nov. 16, 2000, provisional application No. 60/249,643, filed on Nov. 16, 2000, provisional application No. 60/249,497, filed on Nov. 16, 2000.

(51) Int. Cl.
*G06F 15/16* (2006.01)
*G06F 13/12* (2006.01)

(52) U.S. Cl. ....................... 709/247; 710/68
(58) Field of Classification Search ................ 709/247, 709/227, 228, 230; 341/51, 106; 710/68
See application file for complete search history.

(56) References Cited

U.S. PATENT DOCUMENTS

| 5,537,551 | A | * | 7/1996 | Denenberg et al. | ......... 709/247 |
| 5,872,530 | A | * | 2/1999 | Domyo et al. | ............... 341/106 |
| 5,951,623 | A | * | 9/1999 | Reynar et al. | ................. 341/87 |
| 5,956,490 | A | * | 9/1999 | Buchholz et al. | ........... 709/245 |
| 5,973,630 | A | * | 10/1999 | Heath | ........................... 341/87 |
| 6,121,901 | A | * | 9/2000 | Welch et al. | .................. 341/51 |
| 6,222,942 | B1 | * | 4/2001 | Martin | ........................ 382/232 |
| 6,256,652 | B1 | * | 7/2001 | Saperov et al. | ............. 708/203 |
| 6,345,307 | B1 | * | 2/2002 | Booth | ......................... 709/247 |
| 6,359,548 | B1 | * | 3/2002 | Cooper | ......................... 341/50 |
| 6,493,766 | B1 | * | 12/2002 | Buchholz et al. | ........... 709/247 |
| 6,553,141 | B1 | * | 4/2003 | Huffman | ..................... 382/232 |
| 6,751,209 | B1 | * | 6/2004 | Hamiti et al. | ............... 370/349 |
| 6,807,173 | B1 | * | 10/2004 | Lee et al. | .................... 370/389 |

FOREIGN PATENT DOCUMENTS

EP     0 666 651 A2     8/1995

(Continued)

OTHER PUBLICATIONS

Deutsch, P. "Deflate Compressed Data Format Specification version 1.3." IETF RFC 1951. (1996). pp. 1-17.

(Continued)

*Primary Examiner*—Marc D. Thompson
*Assistant Examiner*—Yemane M. Gerezgiher

(57) ABSTRACT

A system, method, and apparatus for increasing the efficiency of the compression of a communication protocol for use over bandwidth limited communication links. One aspect of the present invention uses the knowledge of the structure and content of communication protocols to form a static dictionary or static binary code tree. As a result, the compression efficiency can be greatly increased. Another aspect of the present invention provides a combined static and dynamic dictionary or binary code tree to perform communication protocol compression. In one aspect of the invention, the static binary code tree or static dictionary is constructed by studying flows of data protocols in the conditions of their intended usage.

11 Claims, 4 Drawing Sheets

FOREIGN PATENT DOCUMENTS

| | | |
|---|---|---|
| EP | 0 933 876 A1 | 8/1999 |
| GB | 2320657 A * | 6/1998 |
| WO | WO 9839723 A2 * | 9/1998 |

OTHER PUBLICATIONS

Bormann C., et al. (2000) Robust Header Compression (ROHC). Internet Draft (work in progress), Oct. 2000, <draft-ietf-rohc-rpt-05.txt> pp. 1-156.

PCT International Search Report for PCT/SE01/02549; Nov. 15, 2001.

Stern H P: "Compression Techniques For Mobile Data Terminal Communication", 1991 IEEE 41th Vehicular Technology Conference. St. Louis, May 19-22, 1991, IEEE Vehicular Technology Conference, New York, IEEE, US, vol. Conf. 41, Page(s) 429-432, XP000260216.

Mitzenmacher M.: "On the Hardness of Finding Optimal Multiple Preset Dictionaries." Proceedings of Data Compression Conference, IEEE 2001, Mar. 27-29, 2001, pp. 411-418, XP002902506.

* cited by examiner

STATIC INFORMATION KNOWLEDGE USED WITH BINARY COMPRESSION METHODS

CROSS-REFERENCE TO RELATED APPLICATIONS

This patent application is related to and claims priority from U.S. Patent Application No. 60/249,923, filed Nov. 16, 2000; U.S. patent application Ser. No. 09/814,407 filed concurrently herewith, entitled "Communication System and Method Utilizing Request-Reply Communication Patterns for Data Compression" which claims priority from U.S. patent application Ser. No. 60/249,642 filed Nov. 16, 2000; and U.S. patent application Ser. No. 09/814,268, filed concurrently herewith, entitled "System and Method For Communication With Temporary Compression Table" which claims priority from U.S. Patent Application No. 60/249,643 filed Nov. 16, 2000; and U.S. patent application Ser. No. 09/814,434, filed concurrently herewith, entitled "Communication System and Method For Shared Context Compression" which claims priority from U.S. Patent Application No. 60/249,497 filed Nov. 16, 2000.

BACKGROUND OF THE INVENTION

1. Technical Field of the Invention

The present invention relates to the compression of messages in communication using data protocols, e.g. Internet protocols.

2. Background and Objects of the Present Invention

Two communication technologies that have become widely used by the general public in recent years are cellular telephony and the Internet. Some of the benefits that have been provided by cellular telephony have been freedom of mobility and accessability with reasonable service quality despite a user's location. Until recently the main service provided by cellular telephony has been speech. In contrast, the Internet, while offering flexibility for different types of usage, has been mainly focused on fixed connections and large terminals. However, the experienced quality of some services, such as Internet telephony, has generally been regarded as quite low.

A number of Internet Protocols (IPs) have been developed to provide for communication across the Internet and other networks. An example of such an Internet protocol is the Session Initiation Protocol (SIP). SIP is an application layer protocol for establishing, modifying, and terminating multimedia sessions or calls. These sessions may include Internet multimedia conferences, Internet telephony, and similar applications. As is understood in this art, SIP can be used over either the Transmission Control Protocol (TCP) or the User Datagram Protocol (UDP).

Another example of an Internet Protocol is the Real Time Streaming Protocol (RTSP), which is an application level protocol for control of the delivery of data with real-time properties, such as audio and video data. RTSP may also be used with UDP, TCP, or other protocols as a transport protocol. Still another example of an Internet Protocol is the Session Description Protocol (SDP), which is used to advertise multimedia conferences and communicate conference addresses and conference tool-specific information. SDP is also used for general real-time multimedia session description purposes. SDP is carried in the message body of SIP and RTSP messages. SIP, RTSP, and SDP are all ASCII text based using the ISO 10646 character set in UTF-8 encoding.

Due to new technological developments, Internet and cellular telephony technologies are beginning to merge. Future cellular devices will contain an Internet Protocol (IP) stack and support voice over IP as well as web-browsing, e-mail, and other desirable services. In an "all-IP" or "IP all the way" implementation, Internet Protocols are used end-to-end in the communication system. In a cellular system this may include IP over cellular links and radio hops. Internet Protocols may be used for all types of traffic including user data, such as voice or streaming data, and control data, such as SIP or RTSP data. Such a merging of technologies provides for the flexibility advantages of IP along with the mobility advantages of cellular technology.

As is understood in the art, the SIP, RTSP, and SDP protocols share similar characteristics which have implications in their use with cellular radio access. One of these similarities is the general request and reply nature of the protocols. Typically, when a sender sends a request, the sender stays idle until a response is received. Another similarity, as previously described, is that SIP, RTSP, and SDP are all ASCII text based using the ISO 10646 character set with UTF-8 encoding. As a result, information is usually represented using a greater number of bits than would be required in a binary representation of the same information. Still another characteristic that is shared by the protocols is that they are generally large in size in order to provide the necessary information to session participants.

A disadvantage with IP is the relatively large overhead the IP protocol suite introduces due to large headers and text-based signaling protocols. It is very important in cellular systems to use the scarce radio resources in an efficient manner. In cellular systems it is important to support a sufficient number of users per cell, otherwise implementation and operation costs will be prohibitive. Frequency spectrum, and thus bandwidth, is a costly resource in cellular links and should be used efficiently to maximize system resources.

In the UMTS and EDGE mobile communication systems and in future releases of second generation systems, such as GSM and IS-95, much of the signaling traffic will be performed by using Internet protocols. However as discussed, most of the Internet protocols have been developed for fixed, relatively broadband connections. When access occurs over narrow band cellular links, compression of the protocol messages is needed to meet quality of service requirements, such as set-up time and delay. Typically, compression over the entire communication path is not needed. However, compression of traffic over the radio link, such as from a wireless user terminal to a core network, is greatly desirable.

Standard binary compression methods, such as Lempel-Ziv and Huffman coding, are very general in the sense that they do not utilize any explicit knowledge of the structure of the data to be compressed. The use of such methods on Internet data protocols, e.g., SIP and RTSP, present difficulties for the efficient compression of communication messages. Standard binary compression methods available today are typically designed for large data files. As a consequence, use of such methods for the compression of small messages or messages with few repeated strings results in compression performance generally regarded as very poor. In fact, if the message to be compressed is small and/or contains few repeated strings, the use of some standard compression methods may result in a compressed packet which is actually larger than the original uncompressed packet, thereby achieving a counterproductive result.

One method for implementing a binary compression scheme is the use of dictionary based compression techniques. In general, a dictionary compression scheme uses a data structure known as a dictionary to store strings of symbols which are found in the input data. The scheme reads in input data and looks for strings of symbols which match those in the dictionary. If a string match is found, a pointer or index to the location of that string in the dictionary is output and transmitted instead of the string itself. If the index is smaller than the string it replaces, compression will occur. A decompressor contains a representation of the compressor dictionary so that the original string may be reproduced from the received index. An example of a dictionary compression method is the Lempel-Ziv (LZ77) algorithm. This algorithm operates by replacing character strings which have previously occurred in the file by references to the previous occurrence. This method is, of course, particularly successful in files where repeated strings are common.

Dictionary compression schemes may be generally categorized as either static or dynamic. A static dictionary is a predefined dictionary, which is constructed before compression occurs, and which does not change during the compression process Static dictionaries are typically either stored in the compressor and decompressor prior to use, or transmitted and stored in memory prior to the start of compression operations.

A dynamic or adaptive dictionary scheme, on the other hand, allows the contents of the dictionary to change as compression occurs. In general a dynamic dictionary scheme starts out with either no dictionary or a default, predefined dictionary and adds new strings to the dictionary during the compression process. If a string of input data is not found in the dictionary, the string is added to the dictionary in a new position and assigned a new index value. The new string is transmitted to the decompressor so that it can be added to the dictionary of the decompressor. The position of the new string does not have to be transmitted, as the decompressor will recognize that a new string has been received, and will add the string to the decompressor dictionary in the same position in which it was added in the compressor dictionary. In this way, a future occurrence of the string in the input data can be compressed using the updated dictionary. As a result, the dictionaries at the compressor and decompressor are constructed and updated dynamically as compression occurs.

One method of dictionary compression is of the type known as sliding window compression. In this method the compressor moves a fixed-size sliding window from left to right through the file during compression. The compression algorithm searches the file to the left of the window for matches to strings currently in the window. If a match is found the string is replaced by a reference to the location of the match within the file along with a reference to the length of the match. Alternately, the window may consist of a text window consisting of a large block of recently decoded text and a look-ahead buffer. In this version, the look-ahead buffer is used to search for matches within the text window. If a match is found the string is replaced by a reference to the location of the match within the text window and reference to the length of the match. This information is used by the decompressor which maintains the same dictionary to reproduce the original information.

Another method for the compression of data is the use of a binary code tree. In a binary code tree, symbols or strings which are to be compressed are represented in a tree structure by a variable number of bits such that each symbol is uniquely decodable. Typically, symbols with higher probabilities of occurrence in the input data are represented by a shorter number of bits than those which have lower probabilities of occurrence. In the construction of the binary code tree, individual symbols are laid out as a string of leaf nodes connected to a binary tree. Symbols with higher probabilities of occurrence are represented as shorter branches of the tree resulting in a fewer number of bits being required to represent them. Conversely, symbols with lower probabilities of occurrence are represented as longer branches of the tree requiring a greater number of representation bits. When a string of input data matches a symbol in the binary code tree of the compressor, the code of the symbol is transmitted instead of the symbol itself resulting in data compression. A decompressor receiving the code reconstructs the original symbol or string using an identical binary code tree.

Similarly to dictionary compression, binary code trees may be static or dynamic. In a static binary code tree scheme, a predefined binary code tree is constructed prior to compression and does not change during the compression process. As with static dictionaries, static binary code trees may be stored in the compressor and decompressor in advance, or transmitted and stored prior to the start of compression.

A dynamic or adaptive binary code tree allows for the addition of new symbols or strings to the code tree during the compression process. Various methods may be used to update the nodes of the tree according to the type of binary code tree compression used to allow for the addition of new symbols and the rearrangement of the code tree. The binary code tree in the decompressor must also be updated according to the same rules as the binary code tree in the compressor.

One example of a binary code tree compression scheme is that of a Huffman coding compression scheme. Huffman compression is a general compression method intended primarily for compression of ASCII files. Characters occurring frequently in the files are replaced by shorter codes, i.e. codes with less than the 8 bits used by the ASCII code. Huffman compression can be successful in files where relatively few characters are used.

A general criteria for successful compression using the aforementioned binary compression algorithms is that the file to be compressed is reasonably large. The codes for Huffman compression must not be too large compared to the file which is being compressed. For standard Lempel-Ziv compression, the file to be compressed must be large enough to have many repeated strings to achieve efficient compression. The messages produced by the aforementioned protocols are mostly a few hundred bytes and not large enough to allow efficient compression with the aforementioned algorithms on a message by message basis.

Thus a need exists in the art for increasing the efficiency and performance of the compression of messages sent using communication protocols so that they may be used over bandwidth limited communication links and channels.

SUMMARY OF THE INVENTION

The present invention is directed to a method, system, and apparatus for increasing the efficiency of the compression of a communication protocol for use over bandwidth limited communication links. One aspect of the present invention uses the knowledge of the structure and content of communication protocols to form a static dictionary or static binary code tree. As a result, the compression efficiency can be greatly increased. Another aspect of the present invention provides a combined static and dynamic dictionary or binary code tree to perform communication protocol compression. In one aspect of the invention, the static binary code tree or static dictionary is constructed by studying flows of data protocols in the conditions of their intended usage.

BRIEF DESCRIPTION OF THE DRAWINGS

A more complete understanding of the system, method and apparatus of the present invention may be had by reference to the following Detailed Description when taken in conjunction with the accompanying Drawings wherein.

DETAILED DESCRIPTION OF THE PRESENTLY PREFERRED EXEMPLARY EMBODIMENTS

The present invention will now be described more fully hereinafter with reference to the accompanying Drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
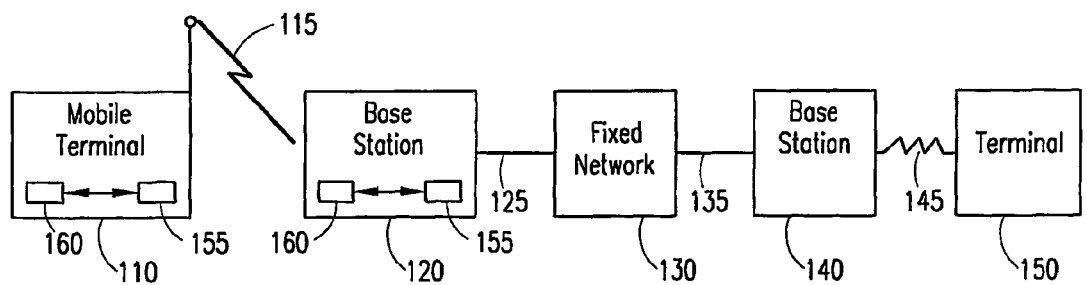
FIG. 1 illustrates an exemplary system for communication in accordance with the present invention.

FIG. 1 illustrates an exemplary system for communication in accordance with the present invention. A mobile terminal 110 is in communication with a base station 120 using communication protocols over a communication link 115, e.g. a wireless link. The base station 120 is in communication with a fixed network 130, such as a PSTN, via a link 125. Fixed network 130 is in communication with a base station 140 via a link 135. Base station 140 is in communication with a terminal 150, which may be a mobile terminal or a fixed terminal, using communication link 145. According to an embodiment of the present invention, the mobile terminal 110 communicates with the base station 120 using compressed data over the communication link 115. Similarly, base station 140 may communicate with terminal 150 using compressed data. It should be understood that components in the system of FIG. 1, such as mobile terminal 110 and base station 140, may include a memory 160 and processor 155 used for storing and executing software instructions which implement compression and decompression algorithms. It should also be understood that the present invention may be used in other communication systems, such as a cellular network, that use communication protocols over links in which compression is desired.

Figure 2:
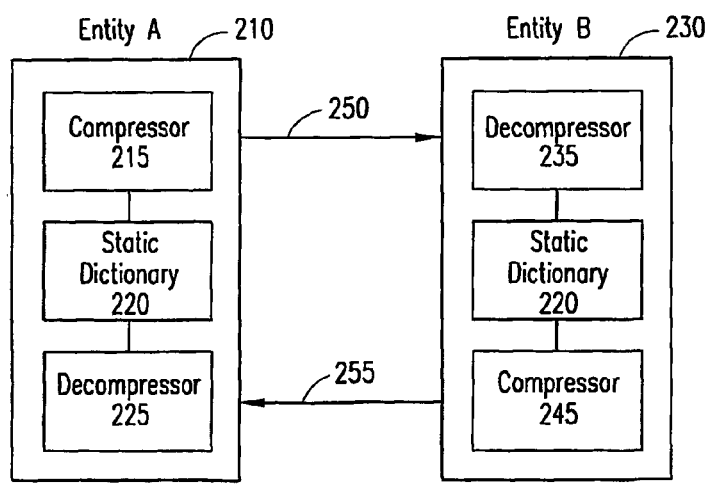
FIG. 2 illustrates an exemplary embodiment in accordance with the present invention.

FIG. 2 illustrates an exemplary embodiment of the present invention. In this embodiment an entity A (210) communicates with an entity B (230) using communication links (250, 255) in which data compression is used. Each entity includes a data compressor (215, 245) and a data decompressor (225, 235). According to an exemplary embodiment of the present invention, a dictionary compression methodology is used. In this embodiment a static dictionary 220 in each entity is used to compress and decompress data to be communicated over the communication links using a data protocol. It should be understood that the compressor and/or decompressor may be implemented using a processor and associated memory having stored therein instructions for a compression/decompression algorithm(s). It should also be understood that the communication entities may comprise a number of communication devices. For example, entity A may comprise mobile terminal 110, and entity B may comprise base station 140.

According to an embodiment of present invention entity A (210) and entity B (230) use identical static dictionaries 220. The static dictionary 220 may be built from protocol field-names and common symbol strings used by the communication protocol, e.g., an Internet protocol, which is being used to communicate over the communication links (250, 255). It should be understood that the communication entities may comprise a number of communication devices. For example, entity A may comprise a mobile terminal, and entity B may comprise a base station.

An example of entries that may be used to form the dictionary include media-type information such as audio, video, and image information. Other examples of dictionary entries which may used to form the dictionary include the protocol token method used, such as GET, HEAD, and POST, or header field names used in a particular protocol, such as Connection, Date, and Accept. In this exemplary embodiment, only the portion of the data packet which may be found in the dictionary is compressed, while the rest of the data packet may be transmitted uncompressed or compressed using an alternate method known to one skilled in the art.

Figure 3:
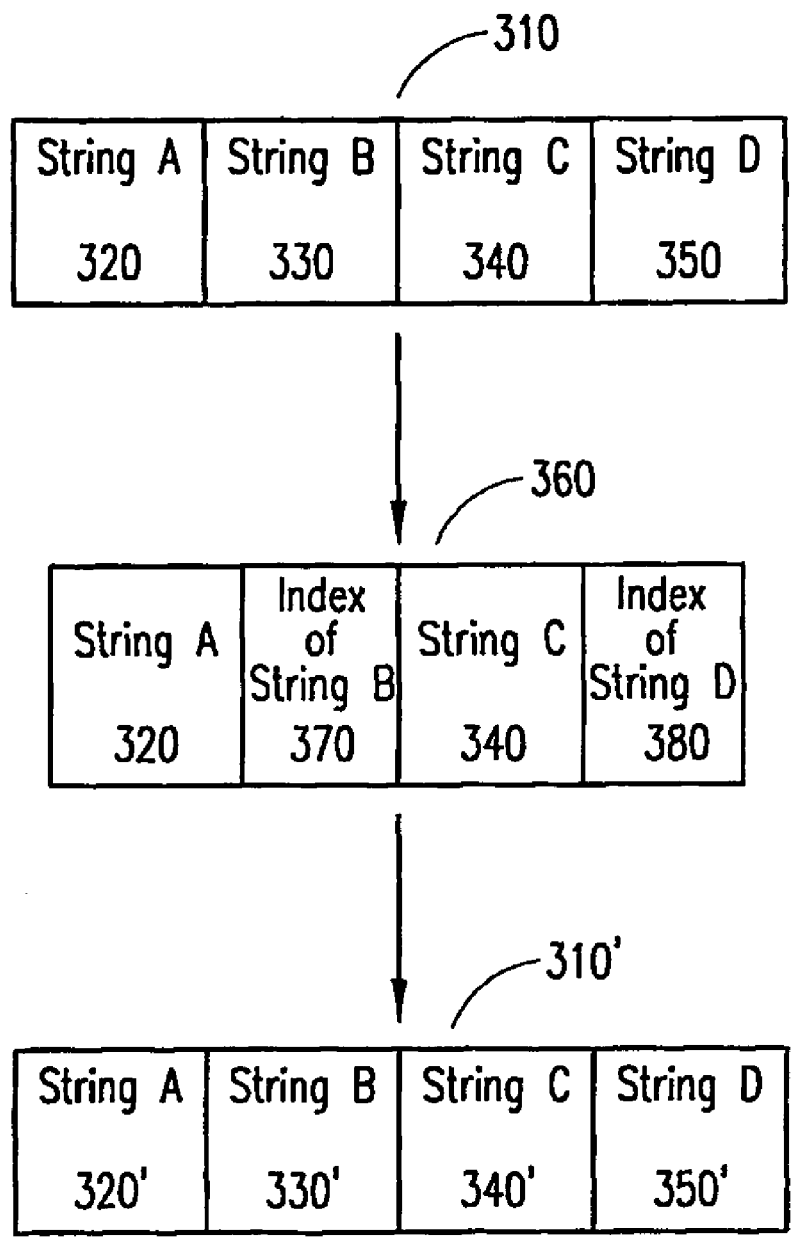
FIG. 3 illustrates an exemplary data packet for compression and decompression in accordance with the present invention.

FIG. 3 illustrates an exemplary data packet 310 for compression and decompression in accordance with the present invention. According to this embodiment, data packet 310 represents information which will be transmitted according to a given data protocol. String A (320) and string C (340) represent portions of the data packet 310 which are not found in the static dictionary. String B (330) and string D (350) represents portions of the data packet 310 which are found in the static dictionary. Instead of sending string B (320) and string D (350), only an index 370 to a location of string B in the static dictionary and an index 380 to a location of string D in the static dictionary need to be transmitted for those portions of the data packet 310. String A (330) and string C (340) may then be added as uncompressed data to index 370 and index 380 to form the compressed data packet 360. Alternately, strings A (320) and string C (340) may be compressed using any of a number of compression methods known to one skilled in the art. The compressed data packet 360 is then transmitted to a receiving entity.

After reception of the compressed data packet 360 by the receiving entity, the index 370 and index 380 are matched to the corresponding entries in the identical static dictionary of the receiving entity to form a reconstruction of string B (330') and string D (350'). The received string A (320') and string C (340') is combined with the reconstruction of string B (330') and string D (350') to form a reconstruction of the original data packet (310'). Alternately, if string A (320) and string C (340) were compressed prior to transmission, they are uncompressed before being combined with the reconstruction of string B (330') and string D (350') to form the reconstruction of the original data packet (310').

Figure 4:
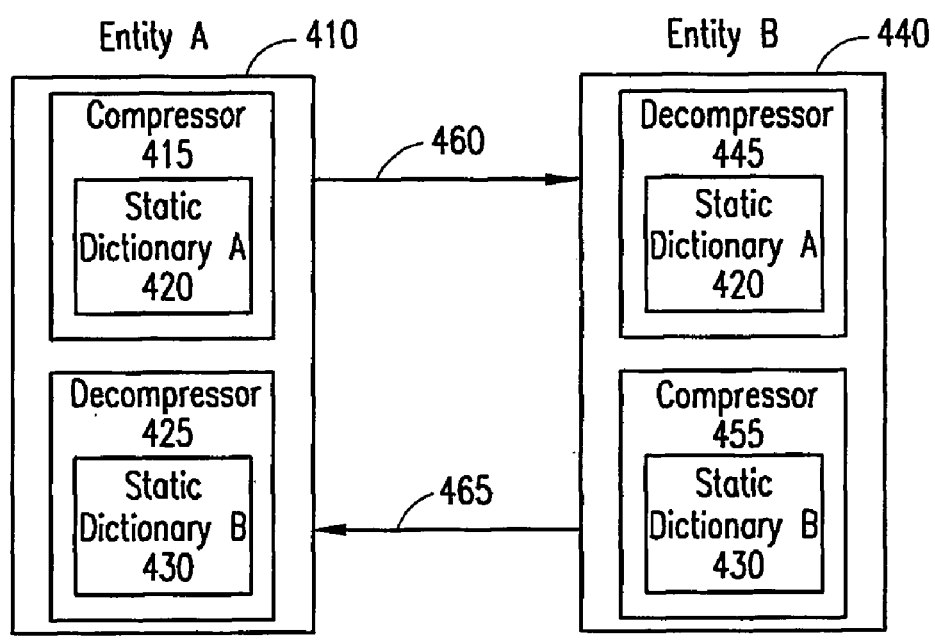
FIG. 4 illustrates another exemplary embodiment in accordance with the present invention.

FIG. 4 illustrates another exemplary embodiment of the present invention. Since the nature and format of data which is transmitted using bidirectional communication is often different for each direction of communication, a compression scheme which can be tailored individually to each communication direction is beneficial. In this embodiment, an entity A (410) includes a data compressor 415 with associated static dictionary A (420), and a data decompressor 425 with associated static dictionary B (430). An entity B (440) includes a data decompressor 445 with associated static dictionary A (420), and data compressor 455 with associated static dictionary B (430).

During operation, entity A (410) sends a message or data compressed using data compressor 415 to entity B (440) over communication link 460 to be decompressed with decompressor 445 using static dictionary A (420). In this manner, compressor 415 of entity A (410) and decompressor 445 of entity B (440) use identical static dictionary A (420) for compression and decompression. Similarly, entity B (440) sends a message or data compressed using data compressor 455 to entity A (410) over communication link 465 to be decompressed using decompressor 425. Compressor 455 of entity B (440) and decompressor 425 of entity A (410) use identical static dictionary B (430) for compression and decompression. This exemplary embodiment of the present invention allows for the design of static dictionaries which are optimized for each direction of communication.

Figure 5:
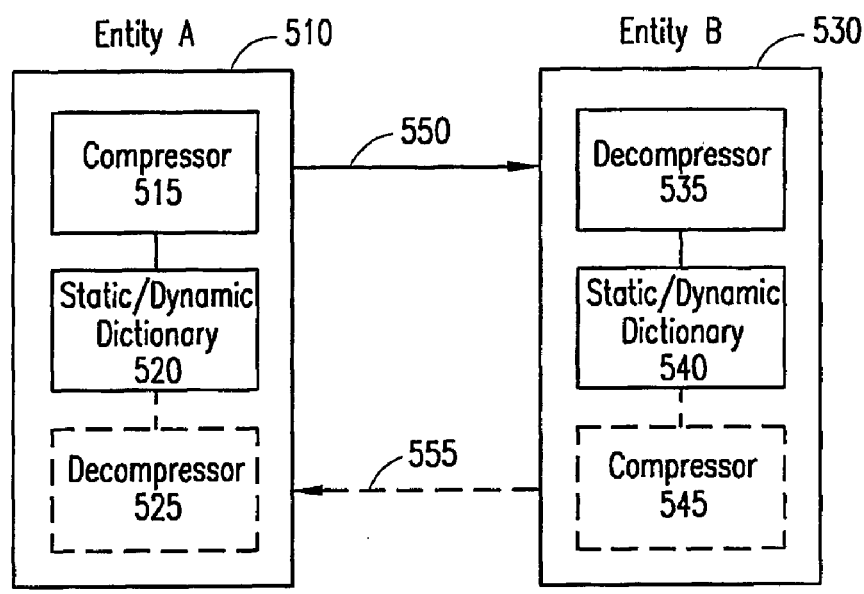
FIG. 5 illustrates another exemplary embodiment in accordance with the present invention.

FIG. 5 illustrates another exemplary embodiment in accordance with the present invention in which a combined static and dynamic dictionary is used. In this embodiment, an initial static dictionary is used as a starting dictionary for the compressor and decompressor at each communication entity. As soon as communication begins the dictionary operates as a dynamic dictionary. In this embodiment, an entity A (510), including a compressor 515 with an associated static/dynamic dictionary 520, communicates with an entity B (530), including a decompressor 535 with an associated static/dynamic dictionary 540, using a first communication link 550.

In entity A (510), a message to be compressed and transmitted to entity B (530) is tested against the dictionary 520. If a portion of the message matches a dictionary entry, that portion is replaced by its corresponding index. The message portion which is not matched to an entry in the dictionary 520, or alternatively selected fields of this message portion, are then added to the dictionary 520 for use in future compression. The index and the uncompressed portion are then transmitted to entity B (530) over the first communication link 550.

Entity B (530) then decodes and separates the received message into the index information and the uncompressed portion. The decompressor 535 in entity B (530) reproduces the compressed information by matching the index to an entry in its dictionary 540, which is then added to the uncompressed data to form the original message. The message portion which was added to the dictionary 520 in entity A (510) is then added to the dictionary 540 of entity B (530) so that each entity maintains matching dictionaries.

Subsequent messages transmitted from entity A (510) to entity B (530) are compressed by using the updated dictionary 520 and decompressed by entity B (530) using updated dictionary 540. As a result, dictionary 520 of entity A (520) and dictionary 540 of entity B are dynamically updated to allow the compression methodology to adapt to the data that is being transmitted, which provides for continual improvement in compression efficiency.

In addition, entity A (510) may include a decompressor 525 and entity B (530) may include a compressor 545, respectively, thus allowing for entity B (530) to send compressed messages to entity A (510) using a second communication link 555. Such an arrangement provides for the capability of bidirectional compressed communication. Decompressor 525 of entity A (510) may use the same static/dynamic dictionary 520 as compressor 515. Similarly, compressor 545 of entity B (530) may use the same static/dynamic dictionary 540 as decompressor 535. Alternately, a separate static/dynamic dictionary may be used for each compressor/decompressor pair, allowing for the use of static/dynamic dictionaries which can be optimized for each direction of communication.

In another exemplary embodiment of the present invention with a combined static and dynamic dictionary, a sliding window dictionary compression method may be used. As in the previous embodiment, an initial static dictionary is used as a starting dictionary for the compressor and decompressor, which then operates as a dynamic dictionary as soon as communication begins. In a first step, a message to be compressed is appended to the dictionary in a first entity containing a compressor. In a following step, the dictionary with the appended message is then processed according to a sliding window compression method, e.g. Lempel-Ziv, to produce the compressed message. In this step, the dictionary may also be compressed along with the attached message.

In still another step, the part of the compressed message corresponding to the static/dynamic dictionary is removed and replaced with a reference or an index to a corresponding location in the dictionary. In a following step, the rest of the compressed message along with the reference information is transmitted to the decompressor in a second entity.

In still another step, the received compressed message is appended to a compressed version of the static/dynamic dictionary in the second entity so that the decompressor has the same dictionary as the compressor. In a following step, the result is then processed by the corresponding decompression method, e.g. Lempel-Ziv, to produce the original message.

In an alternate embodiment of the abovedescribed methodology, the dictionary is not compressed by the compression method. In this embodiment, the dictionary may be preloaded into the buffers and search trees used in the implementation of the compression algorithm prior to operation. When a message to be compressed arrives, the actual compression will start at the position in the buffer in which the message has been loaded. Thus the dictionary will not be compressed, only the message itself. According to this embodiment, the corresponding dictionary of the decompressor will also be in an uncompressed form.

An important aspect of the present invention is the construction of the static dictionary. One exemplary methodology of constructing a static dictionary in accordance with the present invention includes studying flows of data packets to collect statistical data for the desired communication protocols over the communication links in which compression is desired.

Through the use of this statistical data the static dictionary may be constructed using the most frequently used protocol field names and other common strings of a given communication protocol to provide optimal compression of the data or messages which are to be sent. The static dictionary may then be constructed and stored at both a first communication entity and a second communication entity prior to use. Such storage prior to use would be particularly beneficial for use in short communication sessions so that overhead which may occur at the beginning of a communication session is reduced. Alternately the static dictionary may be sent from the compressor to the decompressor at the beginning of a communication session before compression occurs.

As an alternative to dictionary compression schemes, a static binary code tree scheme may be used. A static binary code tree may be constructed using statistical methods such as studying flows of packets for the desired data protocol over the communication link. Using this statistical information, the static binary code tree may be constructed such that protocol field names and other common strings of the data protocol which have a higher probability of occurrence are represented with a smaller number of bits than those that have a lower probability of occurrence. As a result, compression efficiency is increased. One such example of a binary code tree compression scheme which may be used in the practice of the present invention is that of a Huffman coding method.

In still another exemplary embodiment of the present invention, a static binary code tree may be used in combination with a static dictionary. In this exemplary embodiment, a static dictionary is first constructed using a desired methodology such as one of the aforedescribed methodologies in accordance with the present invention. A static binary code tree may then be constructed by studying flows of packets for the desired data protocol with the static dictionary in use and constructing the static binary code tree accordingly. The combined use of static dictionary compression and static binary code tree compression, such as that of Huffman coding, may be used to increase compression efficiency of the transmitted data.

Although various embodiments of the method, system, and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the scope of the invention as set forth and defined by the following claims.

What is claimed is:

1. A communication entity comprising:
   a combined static/dynamic dictionary containing text of at least one field name associated with a communication protocol including at least one of a Session Initiation Protocol (SIP) and a Session Description Protocol (SDP);
   a compressor in communication with said combined static/dynamic dictionary, said compressor using said combined static/dynamic dictionary to compress a data packet associated with at least one of a SIP message and a SDP message by replacing at least one field name therein that matches the text of the at least one field name stored within said dictionary with a pointer to a location in said combined static/dynamic dictionary that contains the matched text;
   said combined static/dynamic dictionary includes a static dictionary which has text stored therein that was added before commencement of communications with a remote communication entity, wherein said text stored therein was selected based upon statistical data flows of said communication protocol; and
   said combined static/dynamic dictionary further includes a dynamic dictionary which has text stored therein that was added after commencement of the communications with the remote communication entity.

2. The communication entity of claim 1, said communication entity further comprising:
   a decompressor in communication with said combined static/dynamic dictionary, said decompressor using said combined static/dynamic dictionary to decompress a compressed data packet received from the remote communication entity.

3. The communication entity of claim 1, wherein said communication entity also uses another compression scheme to further compress the compressed data packet.

4. The communication entity of claim 3, wherein said another compression scheme is a sliding window compression method.

5. A communication entity comprising:
   a combined static/dynamic dictionary containing text of at least one field name associated with a communication protocol including at least one of a Session Initiation Protocol (SIP) and a Session Description Protocol (SDP);
   a decompressor in communication with said combined static/dynamic dictionary, said decompressor using said combined static/dynamic dictionary to decompress a data packet associated with at least one of a SIP message and a SDP message by using at least one pointer in the data packet to locate text associated with the at least one field name stored in the combined static/dynamic dictionary and then replacing the at least one pointer with the text associated with the at least one field name within the data packet;
   said combined static/dynamic dictionary includes a static dictionary which has text stored therein that was added before commencement of communications with a remote communication entity, wherein said text stored therein was selected based upon statistical data flows of said communication protocol; and
   said combined static/dynamic dictionary further includes a dynamic dictionary which has text stored therein that was added after commencement of the communications with the remote communication entity.

6. The communication entity of claim 5, said communication entity further comprising:
   a compressor in communication with said combined static/dynamic dictionary, said compressor using said combined static/dynamic dictionary to compress a data packet to be sent to the remote communication entity.

7. The communication entity of claim 5, wherein said communication entity also uses another decompression scheme to further decompress the data packet.

8. The communication entity of claim 7, wherein said another decompression scheme is a sliding window decompression method.

9. A communication system for facilitating compressed message communication, said communication system comprising:
   a first communication entity comprising:
   a first combined static/dynamic dictionary containing text of at least one field name associated with a communication protocol including at least one of a Session Initiation Protocol (SIP) and a Session Description Protocol (SDP);
   a compressor in communication with said first combined static/dynamic dictionary, said compressor using said first combined static/dynamic dictionary to compress a data packet associated with at least one of a SIP message and a SDP message by replacing at least one field name therein that matches the text of the at least one field name stored within said first combined static/dynamic dictionary with a pointer to a location in said first combined static/dynamic dictionary that contains the matched text;

said first combined static/dynamic dictionary includes a static dictionary which has text stored therein that was added before commencement of communications with a second communication entity, wherein said text stored therein was selected based upon statistical data flows of said communication protocol; and said first combined static/dynamic dictionary further includes a dynamic dictionary which has text stored therein that was added after commencement of the communications with the second communication entity; and said second communication entity comprising:

a second combined static/dynamic dictionary containing text of at least one field name associated with the communication protocol including at least one of the Session Initiation Protocol (SIP) and the Session Desoription Protocol (SDP);

a decompressor in communication with said second combined static/dynamic dictionary, said decompressor using said second combined static/dynamic dictionary to decompress a compressed data packet received from said first communication entity by using at least one pointer in the compressed data packet to locate text associated with the at least one field name stored in the second combined static/dynamic dictionary and then replacing the at least one pointer with the text associated with the at least one field name within the compressed data packet wherein said first combined static/dynamic dictionary being substantially equivalent to said second combined static/dynamic dictionary;

said second combined static/dynamic dictionary includes a static dictionary which has text stored therein that was added before commencement of communications with the first communication entity, wherein said text stored therein was selected based upon statistical data flows of said communication protocol; and said second combined static/dynamic dictionary further includes a dynamic dictionary which has text stored therein that was added after commencement of the communications with the first communication entity.

10. A method of facilitating compressed message communication using a communication protocol including at least one of a Session Initiation Protocol (SIP) and a Session Description Protocol (SDP), said method comprising the steps of:

searching a combined static/dynamic dictionary for text of a field name that matches text of a field name within at least one of a SIP communication message and a SDP communication message, wherein:

said combined static/dynamic dictionary includes a static dictionary which has text stored therein that was added before commencement of communications with a remote communication entity, wherein said text stored therein was selected based upon statistical data flows of said communication protocol; and said combined static/dynamic dictionary further includes a dynamic dictionary which has text stored therein mat was added after commencement of the communications with the remote communication entity;

upon affirmative confirmation that said combined static/dynamic dictionary contained said matched text of the field name, retrieving from said combined static/dynamic dictionary a pointer associated with a location in said combined static/dynamic dictionary that stores the matched text of the field name;

replacing, in said communication message, said text of the field name with said pointer;

adding to said combined static/dynamic dictionary all or a selected portion of the text of the field name in the communication message that was not matched to the text stored in said combined static/dynamic dictionary during said searching step; and transmitting said compressed communication message using said communication protocol.

11. A method of facilitating compressed message communication using a communication protocol including at least one of a Session Initiation Protocol (SIP) and a Session Description Protocol (SDP), said method comprising the steps of:

receiving a SIP or a SDP communication message based upon said communication protocol, said communication message including a pointer retrieving from a combined static/dynamic dictionary, text of a field name which is stored within said combined static/dynamic dictionary at a location identified by said pointer, wherein:

said combined static/dynamic dictionary includes a static dictionary which has text stored therein that was added before commencement of communications with a remote communication entity, wherein said text stored therein was selected based upon statistical data flows of said communication protocol; and said combined static/dynamic dictionary further includes a dynamic dictionary which has text stored therein that was added after commencement of the communications with the remote communication entity;

replacing, in said communication message, said pointer with the text of the field name; and adding to said combined static/dynamic dictionary all or a selected portion of the text of the field name that was not represented by the pointer in the communication message.

* * * * *